(12) United States Patent
Hong

(10) Patent No.: US 7,103,496 B2
(45) Date of Patent: Sep. 5, 2006

(54) DISC INTERFACE, DISC INTERFACE SYSTEM HAVING THE SAME, AND DISC INTERFACING METHOD

(75) Inventor: Si-Hoon Hong, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 126 days.

(21) Appl. No.: 10/911,725

(22) Filed: Aug. 5, 2004

(65) Prior Publication Data
US 2005/0065748 A1 Mar. 24, 2005

(30) Foreign Application Priority Data
Sep. 9, 2003 (KR) .............. 10-2003-0063407

(51) Int. Cl.
*G01M 19/00* (2006.01)
(52) U.S. Cl. ............................... 702/124
(58) Field of Classification Search ............ 702/124
See application file for complete search history.

(56) References Cited

U.S. PATENT DOCUMENTS 6,263,373 B1* 7/2001 Cromer et al. ............... 709/250
2003/0233499 A1* 12/2003 Choi ........................... 710/36
2004/0064590 A1* 4/2004 Starr et al. ................... 709/250

* cited by examiner

*Primary Examiner*—John Barlow
*Assistant Examiner*—Demetrius Pretlow
(74) *Attorney, Agent, or Firm*—Harness, Dickey & Pierce, P.L.C.

(57) ABSTRACT

A disc interface, a disc interface system having the same, and a disc interfacing method may be provided. The disc interface may receive a reduced quantity of test command information at a lower speed which may correspond to an operation speed of a general test apparatus to automatically generate a real-time testbench signal. The digital unit of the disc interface may be operated at an actual operation speed though the test command information and debugging data may be input and output at a lower speed. Thus, digital circuits operating at a high speed may be tested using an less expensive test apparatus.

22 Claims, 4 Drawing Sheets

DISC INTERFACE, DISC INTERFACE SYSTEM HAVING THE SAME, AND DISC INTERFACING METHOD

BACKGROUND OF THE INVENTION

This application claims the priority of Korean Patent Application No. 2003-63407, filed on Sep. 9, 2003, in the Korean Intellectual Property Office, the disclosure of which is incorporated herein in its entirety by reference.

1. Field of the Invention

The present invention relates to a disc interface system, and more particularly, to a disc interface system that may interface a personal computer with a CD-ROM drive and/or a hard disc drive.

2. Description of the Related Art

FIG. 1 is a block diagram of a conventional disc interface system 100 which may include a disc interface 120. Referring to FIG. 1, the conventional disc interface system 100 may include a computer 110, a disc interface 120 which may include a physical layer unit 121 and a digital unit 123, and a back-up device 130 which may operate a hard disc and/or CD-ROM. The computer 110 and disc interface 120 may exchange data in the form of a differential signal at 1.5 Gbps through serial lines. In the disc interface 120, data may be transmitted and received at a rate of greater than 150 Mbps between the physical layer unit 121 and digital unit 123. Between the digital unit 123 and back-up device 130, data may be transmitted and received at a rate of approximately 133 Mbps. The physical layer unit 121 may be an analog circuit and the digital unit 123 may perform data conversion and transmission according to a link and/or an Integrated Drive Electronics (IDE) Interface standard (for example, the Advanced Technology Attachment (ATA) standard).

The digital unit 123 of a chip (for example, an integrated circuit chip), which may correspond to the disc interface 120 may not be tested at the actual operation speed because there may be no digital circuit test apparatus capable of testing the digital circuit at a speed of greater than 150 Mbps. If such test apparatus exists, the test apparatus may be difficult to utilize because the apparatus may only test mounted digital circuits, and/or may not be cost-effective. The digital unit 123 of the chip (for example, an integrated circuit chip), which may correspond to the disc interface 120, may be tested at an operation speed lower than the actual operation speed, however, erroneous operations of the circuit, which may be generated at the actual operation speed, may not be detected and undetected defects of the disc interface may remain.

The apparatus for testing the digital unit 123 of the disc interface 120, which may support a hard disk interface standard (for example, Serial Advanced Technology Attachment (SATA)), may transmit data which may be in the form of a differential, Tx, and/or Rx signal which may be input and or output to the computer 110 at 1.5 Mbps. The apparatus may also be able to probe signals which may be transmitted between the physical layer unit 121 and digital unit 123 through at least ten pins at greater than 150 MHz.

In the related art the physical layer unit 121 and digital unit 123 may be separately tested. The method may require pins which may send signals, which may have been transmitted between the physical layer unit 121 and digital unit 123, to the outside of a chip. Delay characteristics of the pins and/or a probe tip may make probing signals of 150 MHz or higher difficult, and thus it may be impossible to separately test the digital unit 123 at an actual operation speed.

SUMMARY OF THE INVENTION

Exemplary embodiments of the present invention may provide a disc interface which may receive a reduced quantity of test command information, at a lower speed which may correspond to an actual operational speed of a general test apparatus. The general test apparatus may automatically generate a real-time testbench signal, may monitor input/output data to debug the testbench signal, and may monitor a disc interface system which may include the disc interface.

Exemplary embodiments of the present invention may also provide a disc interfacing method, by which a reduced quantity of test command information may be received at a lower speed which may correspond to an actual operational speed of a general test apparatus, may automatically generate and may monitor input/output data to debug a real-time testbench signal.

In exemplary embodiments of the present invention, a general test apparatus may include a testbench signal generator which may encode test command input information, which may be in response to a logic state of the test enable signal, to generate the testbench signal, and a debugging information outputting unit which may decode a digital transmission information to output debugging information.

The testbench signal generator may include, a state machine unit which may generate storage information, which may correspond to the test command input information and may be in response to the a logic state of the test enable signal, a register which may store test command input information which may be in response to the storage information, and an encoding and scrambling unit which may encode and/or scramble test command input information output which may be from the register and may generate the testbench signal.

The debugging information outputting unit may include a FIFO memory which may store and/or output digital transmission information, and a decoding and descrambling unit which may decode and/or descramble the digital transmission information output which may be from the FIFO memory and may output the debugging information. The FIFO memory may output information about the occupied capacity of the memory which may be in response to the storage of the digital transmission information, and the state machine unit may check the information about the occupied capacity of the memory to judge that overflow may occur when the occupied capacity may exceed a threshold and may output hold primitive information through a connection line through which the testbench signal may be output.

The state machine unit may receive the debugging information and may use the information as a part of the test command information.

In another exemplary embodiment of the present invention a general testing method may encode test command input information which may be in response to a logic signal state of a test enable signal and may generate a testbench signal, and may decode digital transmission information and/or output debugging information. The encoding may include, generating storage information which may correspond to test command input information and may be in response to the logic state of the test enable signal, storing test command input information which may be in response to storage information, and encoding and/or scrambling test command input information which may be output from the register and may generate the testbench signal.

In another exemplary embodiment of the present invention, there may be provided a disc interface which may comprise a test unit, a physical layer unit, a multiplexer and a digital unit. The test unit may encode a test command input information in response to a second logic state of a test enable signal, may generate a testbench signal as digital reception information and may decode digital transmission information input as a test result to output debugging information. The test unit may not output the testbench signal and debugging information at a first logic state of the test enable signal. The physical layer unit may convert a computer output signal to output physical layer information, as digital reception information and may convert the digital transmission information to generate a computer input signal. The multiplexer may select one of the testbench signal and physical layer information, which may be in response to the logic state of the test enable signal, and may output the digital reception information. The digital unit may process the digital reception information to output interface output information and may generate the digital transmission information in response to the digital reception information and/or interface input information. The test unit may include a testbench signal generator and a debugging information outputting unit. The testbench signal generator may encode the test command input information which may be in response to the second logic state of the test enable signal and may generate the testbench signal. The debugging information outputting unit may decode the digital transmission information to output the debugging information.

The testbench signal generator may include a state machine unit, a register and an encoding and scrambling unit. The state machine unit may generate storage information which may correspond to the test command input information which may be in response to the second logic state of the test enable signal. The register may store the test command input information which may be in response to the storage information. The encoding and scrambling unit may encode and scramble the test command input information output from the register and may generate the testbench signal.

The debugging information outputting unit may include a FIFO memory and a decoding and descrambling unit. The FIFO memory may sequentially store and output the digital transmission information. The decoding and descrambling unit may decode and descramble the digital transmission information output from the FIFO memory to output the debugging information.

The FIFO memory may output information pertaining to the occupied capacity of the memory which may be in response to the storage of the digital transmission information. The state machine unit may check the information pertaining to the occupied capacity of the memory to judge that overflow may occur when the occupied capacity may exceed a threshold. The state machine unit may output hold primitive information through a connection line through which the testbench signal may be output. The state machine unit may receive the debugging information and may use the information as a part of the test command information. The computer output signal and computer input signal may be differential signals.

In another exemplary embodiment of the present invention, there may be provided a disc interface system which may comprise a disc interface and a back-up device. The disc interface may encode test command input information which may generate a testbench signal, may convert a computer output signal to generate physical layer information, may process one of the testbench signal and physical layer information as digital reception information to output interface output information, and may convert digital transmission information, which may have been generated in response to the digital reception information or interface input information, to output a computer input signal and/or decode the digital transmission information to output debugging information. The back-up device may output the interface input information as a result which may be obtained by executing the test command which may be in response to the interface output information.

The disc interface system may further comprise a computer which may generate a computer output signal which may correspond to a command of accessing the back-up device and may process the computer input signal which may correspond to the interface input information.

In another exemplary embodiment of the present invention, there may be provided a disc interfacing method, which may comprise encoding test command input information in response to a second logic state of a test enable signal which may generate a testbench signal as digital reception information and may decode digital transmission information input as a test result to output debugging information; may output none of the testbench and debugging information at a first logic state of the test enable signal; may convert a computer output signal, which may output physical layer information as the digital reception information and may convert the digital transmission information, to generate a computer input signal; may select one of the testbench signal and/or physical layer information, which may be in response to the logic state of the test enable signal, to output the digital reception information; and may process the digital reception information to output interface output information and may generate the digital transmission information in response to the digital reception information and/or interface input information.

In another exemplary embodiment of the present invention, there may be provided a disc interfacing method, which may comprise encoding test command input information which may generate a testbench signal; may convert a computer output signal which may generate physical layer information; may process one of the testbench signal and/or physical layer information as digital reception information which may output interface output information; may convert digital transmission information, which may be generated in response to the digital reception information and/or interface input information, to output a computer input signal; may decode the digital transmission information which may output debugging information; and may output the interface input information by a back-up device as a result, which may be obtained when the back-up device may execute a command, which may be in response to the interface output information.

BRIEF DESCRIPTION OF THE DRAWINGS

Exemplary embodiments of the present invention will become more apparent by describing in detail exemplary embodiments thereof with reference to the attached drawings in which.

DETAILED DESCRIPTION OF EXEMPLARY EMBODIMENTS OF THE PRESENT INVENTION

Figure 1:
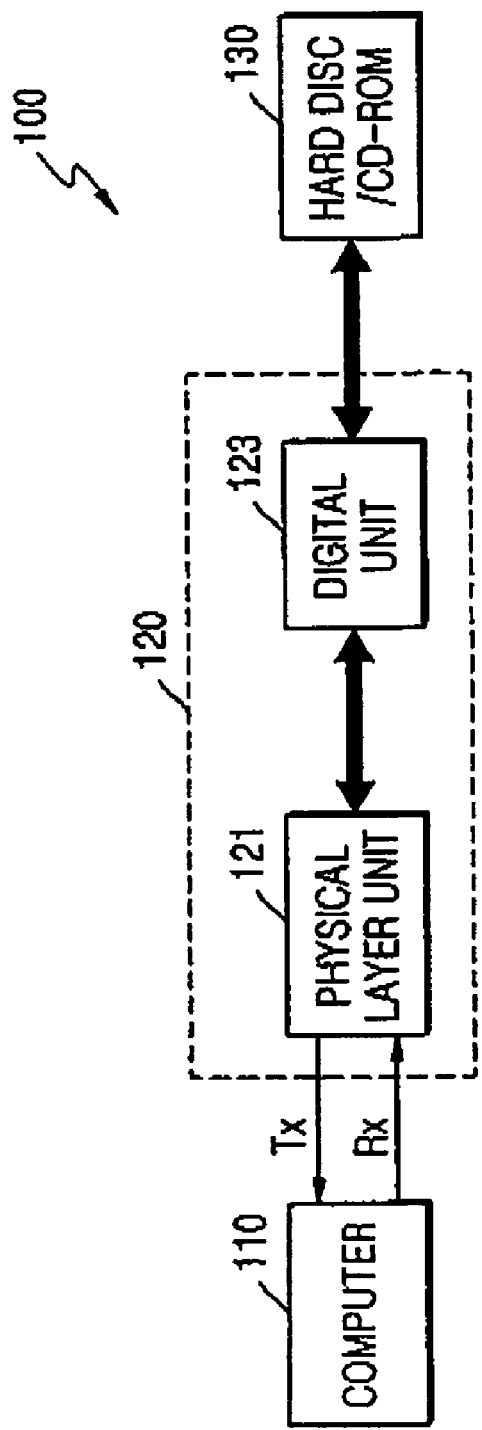
FIG. 1 is a block diagram of a conventional disc interface system having a disc interface.

The present invention will now be described more fully with reference to the accompanying drawings, in which exemplary embodiments of the invention may be illustrated. The invention may, however, be embodied in many different forms and should not be construed as being limited to the exemplary embodiments set forth herein; rather, these exemplary embodiments may be provided so that this disclosure will be thorough and complete, and will fully convey the concept of the invention to those skilled in the art. Throughout the drawings, like reference numerals refer to like elements.

Figure 2:
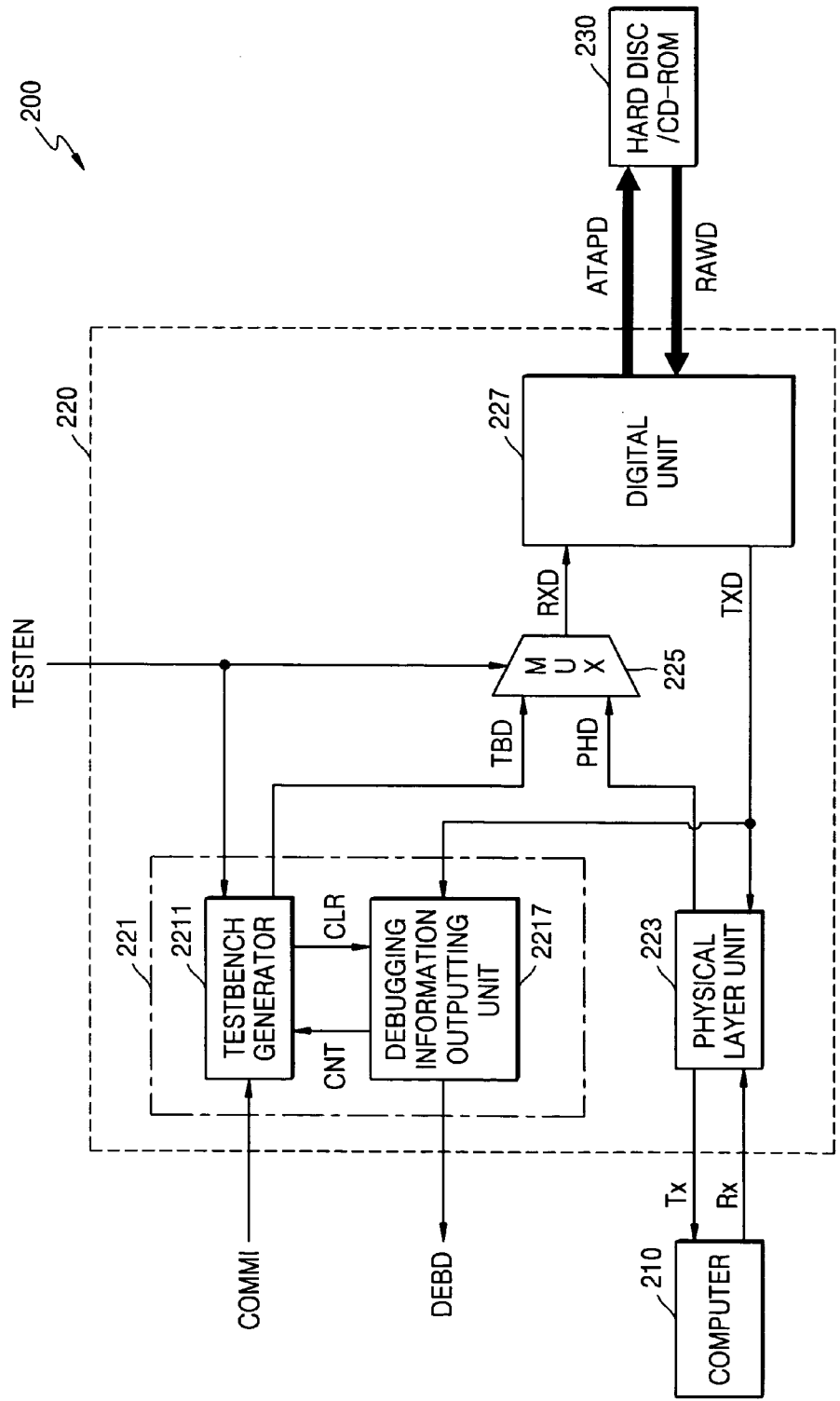
FIG. 2 is a block diagram of a disc interface system including a disc interface according to an exemplary embodiment of the present invention.

FIG. 2 is a block diagram of a disc interface system 200 having a disc interface 220 according to an exemplary embodiment of the present invention. Referring to FIG. 2, the disc interface system 200 may include the disc interface 220 and a back-up device 230, such as a hard disc drive or a CD-ROM drive. The disc interface system 200 may further include a computer 210.

The disc interface 220 may encode test command input information COMMI, which may generate a testbench signal TBD and/or may convert a signal Rx output from the computer 210, to generate physical layer information PHD. The disc interface 220 may select one of the testbench signal TBD and/or physical information PHD as digital reception information RXD and may process the digital reception information RXD to output interface output information ATAPD. The disc interface 220 may convert digital transmission information TXD, which may have been generated in response to the digital reception information RXD and/or interface input information RAWD, to output a signal Tx input to the computer 210 and/or decode the digital transmission information TXD and output debugging information DEBD.

The back-up device 230 may execute the test command in response to the interface output information ATAPD and/or output the interface input information RAWD which may be a result obtained by executing the test command. The back-up device 230 may execute commands to store and/or read information as instructed by a user and/or the computer 210. Commands of storing information may include WRITE MULTIPLE and WRITE DMA (Direct Memory Access), and commands of reading information may include READ MULTIPLE and READ DMA. The back-up device 230 may transmit a device ID which may be in response to a command of identifying a device IDENTIFY DEVICE and may initialize parameters, which may include a feature setting and/or in response to a command of setting a feature SET FEATURE.

The computer 210 may generate the computer output signal Rx, which may correspond to a command of accessing the back-up device 230, and may process the computer input signal Tx, which may correspond to the interface input information RAWD. The computer output signal Rx and/or computer input signal Tx may be general digital signals, differential signals, and the like. The differential signal may be used in a system with higher speeds, which may have signal lines which may be used to connect boards, may reduce the number of signal lines and may reduce the probability of the signals from being distorted due to electromagnetic interference.

Figure 3:
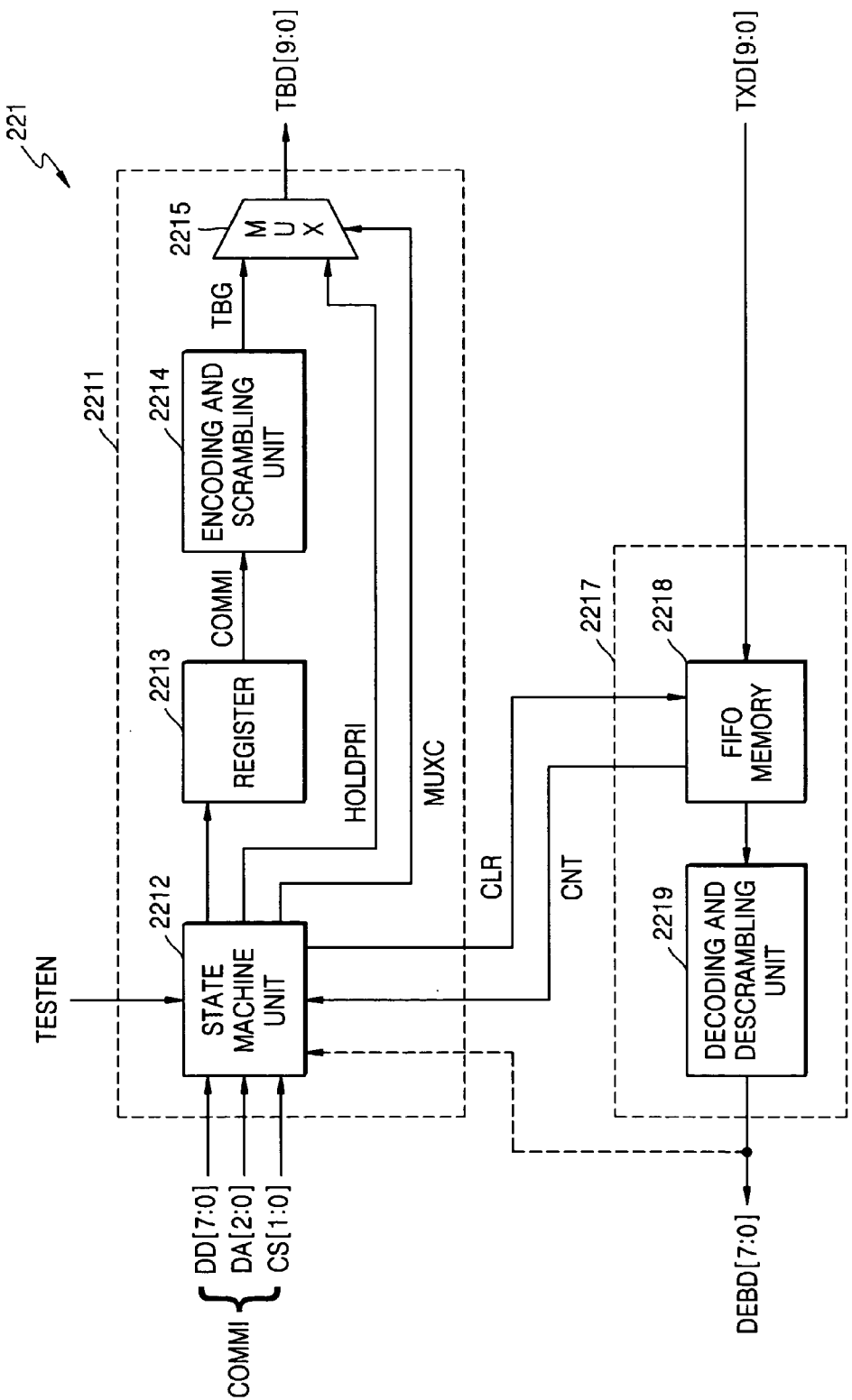
FIG. 3 is a block diagram of an example of the test unit of FIG. 2.

In the disc interface system 200, the disc interface 220 may include a test unit 221, which may test whether or not a digital unit 227 may be operating normally. The test unit 221 may receive the test command input information COMMI at a lower speed corresponding to an operational speed of a general test apparatus, which may automatically generate the real-time testbench signal TBD. The test unit 221 may also monitor input/output data to debug the real-time testbench signal. The test command input information COMMI may correspond to at least one of the aforementioned commands IDENTIFY DEVICE, SET FEATURE, READ MULTIPLE, WRITE MULTIPLE, READ DMA and WRITE DMA. These commands may be input to the test unit 221 sequentially or in parallel. While other commands may be used for testing the digital unit 227, the operation of the digital unit 227 of the disc interface 220 may be tested with a reduced number of test commands as described above. The test command input information COMMI may be composed of 8-bit information DD on a command and/or parameter and 5-bit address information which may include a data address DA and/or a chip select address CS, as shown in FIG. 3. The disc interface 220 may be explained in more detail below.

The disc interface 220, according to an exemplary embodiment of the present invention, may include the test unit 221, a physical layer unit 223, a multiplexer 225 and the digital unit 227. The physical layer unit 223 and digital unit 227 may be conventional elements which may interface the computer 210 with the back-up device 230 through a hard disk interface standard (for example, Serial Advanced Technology Attachment (SATA)). The test unit 221 may test the digital unit 227 at an actual operational speed.

The test unit 221 may encode the test command input information COMMI, which may be in response to a second logic state (logic 'high' state, for example) of a test enable signal TESTEN, and may generate the testbench signal TBD as digital reception information RXD. The test unit 221 may decode the digital transmission information TXD input thereto, which may be a test result, to output debugging information DEBD. The test unit 221 may not output the testbench signal TBD and/or debugging information DEBD at a first logic state (logic 'low' state, for instance) of the test enable signal TESTEN. The test unit 221 may receive the test command input information COMMI, may output the debugging information DEBD which may be in response to a clock signal at greater than 60 MHz, and may output the testbench signal TBD according to a clock signal at greater than 150 MHz.

The test unit 221 may include a testbench signal generator 2211 and/or a debugging information outputting unit 2217. The testbench signal generator 2211 may encode the test command input information COMMI, which may be in response to the second logic state of the test enable signal TESTEN, and may generate the testbench signal TBD. The debugging information outputting unit 2217 may decode the digital transmission information TXD and may output the debugging information DEBD. The test unit 221 may be described later with reference to FIG. 3.

The physical layer unit 223 may convert the computer output signal Rx, which may output the physical layer information PHD as the digital reception information RXD, and may convert the digital transmission information TXD which may generate the computer input signal Tx. The physical layer unit 223 may receive and process the computer output signal Tx, which may be a differential signal, and may generate and output the computer input signal Tx, which may be a differential signal, when the disc interface 220 may not be tested but may operate normally. The computer output signal Rx may be a differential signal, which may transfer information which may be related to a command of storing and/or reading information as instructed by the computer 210 and/or user, and may be transmitted from the computer 210. The computer input signal Tx may be a differential signal which may transfer information, which may be generated by the digital unit 227 and/or back-up device 230, which may be in response to the computer output signal Rx and may be transmitted from the physical layer unit 223.

The multiplexer 225 may select one of the testbench signal TBD and/or physical layer information PHD, which may be in response to the logic state of the test enable signal TESTEN, and may output the selected information as the digital reception information RXD. When the digital unit 227 may be tested, the test enable signal TESTEN may be in the logic high state and the multiplexer 225 may output the testbench signal TBD. When the digital unit 227 of the disc interface 220 may be operating normally, the test enable signal TESTEN may be in the logic low state and the multiplexer 225 may output the physical layer information PHD.

The digital unit 227 may process the digital reception information RXD, to output the interface output information ATAPD, and may generate the digital transmission information TXD in response to the digital reception information RXD and/or interface input information RAWD. Since information may be transmitted according to a standard Integrated Drive Electronics (IDE) Interface (for example, the Advanced Technology Attachment (ATA) standard) between the digital unit 227 and/or back-up device 230, the interface output information ATAPD and/or interface input information RAWD may be packet data conforming with a standard Integrated Drive Electronics (IDE) Interface (for example, the Advanced Technology Attachment (ATA) standard).

FIG. 3 is a block diagram of the test unit 221 according to an exemplary embodiment of FIG. 2.

Referring to FIG. 3, the testbench signal generator 2211 may include a state machine unit 2212 which may include a register 2213, an encoding and/or scrambling unit 2214, and a second multiplexer 2215. The state machine unit 2212 may generate and/or output storage information, which may correspond to the test command input information COMMI which may be in response to the second logic state of the test enable signal TESTEN. The state machine unit 2212 may receive the debugging information DEBD which may be a part of the test command information. The register 2213 may store the test command input information COMMI which may be in response to the storage information. The encoding and scrambling unit 2214 may encode and/or scramble the test command input information COMMI output from the register 2213 which may generate the testbench signal TBG. Encoding and/or scrambling operations may encode the 8-bit information on a command and/or parameter into 10-bit data and/or may perform code conversion, which may reduce electromagnetic interference. The encoding and/or scrambling operations may not be restricted by the number of bits.

The debugging information output unit 2217 may include a FIFO memory 2218 and a decoding and descrambling unit 2219. The FIFO memory 2218 may sequentially store and/or output the digital transmission information TXD. The FIFO memory 2218 may be reset by a control signal CLR of the state machine unit 2212 which may check if an abnormal state may be generated. The decoding and descrambling unit 2219 may decode and/or descramble the digital transmission information TXD output from the FIFO memory 2218 and may output the debugging information DEBD. The decoding and/or descrambling operations may decode the 10-bit digital transmission information TXD into 8-bit information and/or may descramble the information. The decoding and descrambling operations may not be restricted by the number of bits.

The FIFO memory 2218 may output information CNT about the occupied capacity of the memory, which may be in response to the storage of the digital transmission information TXD. The state machine unit 2212 may check the information CNT. When the occupied capacity of the memory exceeds a threshold, the state machine unit 2212 may judge that overflow may occur and/or output hold primitive information HOLDPRI through a connection line (TBD output line) which output the testbench signal TBD. The hold primitive information HOLDPRI may be output through the second multiplexer 2215 when a multiplexer control signal MUXC may be in a logic low state. When the multiplexer control signal MUXC may be in a logic high state, the testbench signal TBG, which may be output from the encoding and scrambling unit 2214, may be output through the second multiplexer 2215. The hold primitive information HOLDPRI may temporarily hold the digital unit 227 from outputting the digital transmission information TXD. When the hold primitive information HOLDPRI may not be output, the digital unit 227 may output the digital transmission information TXD again.

Figure 4:
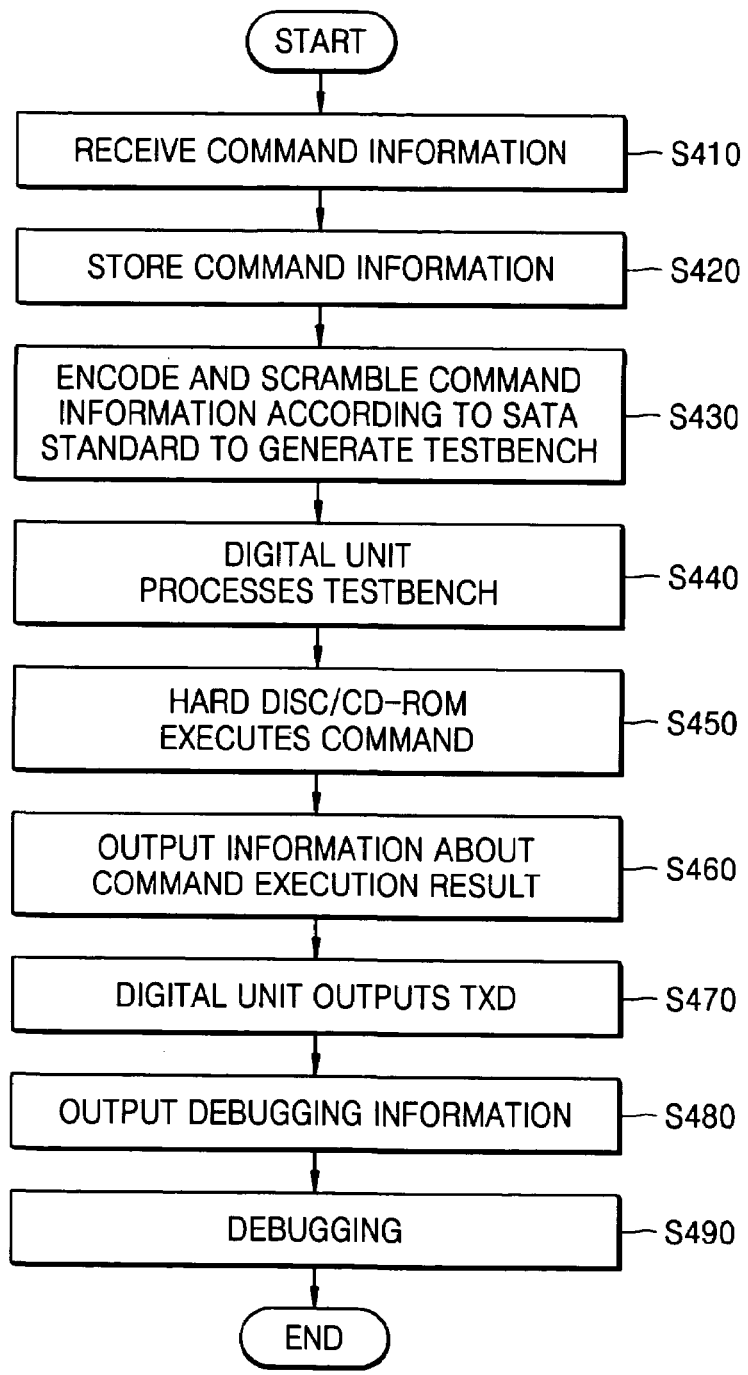
FIG. 4 is a flow chart showing an example operation of the disc interface system of FIG. 2.

FIG. 4 is a flow chart showing an exemplary embodiment of the operation of the disc interface system 200 of FIG. 2, more particularly, the operation of testing the digital unit 227 according to an exemplary embodiment of the disc interface system 200. The state machine unit 2212 may receive command information, for example, test command input information COMMI, which may be in response to the second logic state of the test enable signal TESTEN at S410, and may generate storage information which may correspond thereto. The register 2213 may store the test command input information COMMI, which may be in response to the storage information at S420. The encoding and scrambling unit 2214 may encode and/or scramble the test command input information COMMI output from the register 2213 according to a hard disk interface standard (for example, Serial Advanced Technology Attachment (SATA) standard) and may generate the testbench signal TBD at S430.

The testbench signal TBD, which may be output through the second multiplexer 2215, may be delivered to the digital unit 227 which may process the testbench signal TBD received as the digital reception information RXD to output the interface output information ATAPD, and may conform with a standard Integrated Drive Electronics (IDE) Interface (for example, the Advanced Technology Attachment (ATA) standard) at S440. The back-up device 230 (for example, such as a hard disc driver and/or CD-ROM drive) may receive the interface output information ATAPD, may execute a corresponding command, which may be in response to the interface output information ATAPD, and may output the interface input information RAWD, which may conform with a standard Integrated Drive Electronics (IDE) Interface (for example, the Advanced Technology Attachment (ATA) standard), as a command execution result at S450 and S460. The digital unit 227 may process the interface input information RAWD and may output the digital transmission information TXD at S470. The FIFO memory 2218 may sequentially store and/or output the digital transmission information TXD, and the decoding and descrambling unit 2219 may decode and/or descramble the digital transmission information TXD, which may be output from the FIFO memory 2218, and may output the debugging information DEBD at S480. The FIFO memory 2218 may output the information CNT about the occupied capacity of the memory in response to the storage of the digital transmission information TXD. The state machine unit 2212 may check the information CNT, may judge that overflows have occurred when the occupied capacity may exceed a threshold, and may output the hold primitive information HOLD-PRI through the connection line (TBD output line) which may output the testbench signal TBD.

The user may confirm the debugging information DEBD as a test result which may be expected for the test command input information COMMI at S490. The user may compare the debugging information DEBD which may be output from the decoding and descrambling unit 2219 with an expected test result to confirm if they correspond to each other. The user may judge that the digital unit may have an error if the results do not correspond. If the debugging information DEBD may correspond to the expected test result, the user may input other test command input information COMMI to the test unit 221. When the debugging information DEBD may correspond to the expected test result for the test command input information COMMI, which may correspond to the commands such as IDENTIFY DEVICE, SET FEATURE, READ MULTIPLE, WRITE MULTIPLE, READ DMA and WRITE DMA as described above, the user may judge that the digital unit may not have any errors.

The disc interface system 200, according to an exemplary embodiment of the present invention, may receive a reduced quantity of test command information COMMI through the disc interface 220 which may have the test unit 221 which may automatically generate and/or may monitor input/output data to debug a real-time testbench signal.

In the disc interface system, according to an exemplary embodiment of the present invention, the disc interface may receive a reduced quantity of test command information at a lower speed, which may correspond to an operation speed of a general test apparatus, and may automatically generate the real-time testbench signal. The digital unit of the disc interface may be operated at an actual operation speed while the test command information and/or debugging data may be input and output at a lower speed. Thus, digital circuits which may operate at a higher speed may be tested using a cost effective test apparatus.

Although the test command input information COMMI, according to exemplary embodiments of the present invention, may be composed of 8-bit information DD on a command and parameter and 5-bit address information which may include a data address DA and/or a chip select address CS, it will be understood that test command input information and address information may be composed of any number of bits as desired by one of ordinary skill in the art.

Although the decoding and/or descrambling operations, according to exemplary embodiments of the present invention, may decode the 10-bit digital transmission information TXD into 8-bit information, it will be understood that the digital transmission information TXD, may be composed of and decoded into any number of bits as desired by one of ordinary skill in the art.

Although exemplary embodiments of the present invention have been described as utilizing ATA and SATA standards, it will be understood any interface may be utilized within the present invention as may be desired by one of ordinary skill in the art.

Although exemplary embodiments of the present invention have been described as utilizing a 'high' logic state, and a 'low' logic state, it will be understood that any logic state may be utilized within the present invention as may be desired by one of ordinary skill in the art.

Although exemplary embodiments of the present invention have been described as utilizing a hard disc drive and/or a CD-ROM drive as a back-up device, it will be understood that the back-up device may be any storage device as desired by one of ordinary skill in the art. Further, it will also be understood that the disc interface and/or the back-up device, as described with respect to exemplary embodiments of the present invention, may be implemented as hardware and/or software as desired by one of ordinary skill in the art.

Although exemplary embodiments of the present invention have been described with regard to a computer, it will also be understood that any processing device may be utilized as desired by one of ordinary skill in the art.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A disc interface, comprising:
   a test unit that encodes test command input information in response to a second logic state of a test enable signal to generate a testbench signal as digital reception information and decodes digital transmission information input as a test result to output debugging information, the test unit not outputting the testbench signal and debugging information at a first logic state of the test enable signal;
   a physical layer unit that converts a computer output signal to output physical layer information as the digital reception information and converts the digital transmission information to generate a computer input signal;
   a multiplexer that selects one of the testbench signal and physical layer information in response to the logic state of the test enable signal to output the digital reception information; and
   a digital processing unit that processes the digital reception information to output interface output information and generates the digital transmission information in response to the digital reception information or interface input information.

2. The disc interface as claimed in claim 1, wherein the test unit comprises:
   a testbench signal generator that encodes the test command input information in response to the second logic state of the test enable signal to generate the testbench signal; and
   a debugging information outputting unit that decodes the digital transmission information to output the debugging information.

3. The disc interface as claimed in claim 2, wherein the testbench signal generator comprises:
   a state machine unit that generates storage information corresponding to the test command input information in response to the second logic state of the test enable signal;
   a register that stores the test command input information in response to the storage information; and
   an encoding and scrambling unit that encodes and scrambles the test command input information output from the register to generate the testbench signal.

4. The disc interface as claimed in claim 3, wherein the debugging information outputting unit includes a FIFO memory that stores and outputs the digital transmission information, and a decoding and descrambling unit that decodes and descrambles the digital transmission information output from the FIFO memory to output the debugging information.

5. The disc interface as claimed in claim 4, wherein the FIFO memory outputs information on the occupied capacity of the memory in response to the storage of the digital transmission information, and the state machine unit checks the information on the occupied capacity of the memory to judge that overflow occurs when the occupied capacity exceeds a threshold and outputs hold primitive information through a connection line through which the testbench signal is output.

6. The disc interface as claimed in claim 3, wherein the state machine unit receives debugging information as a part of the test command information.

7. The disc interface as claimed in claim 1, wherein the computer output signal and computer input signal are differential signals.

8. A disc interface system, comprising:
a disc interface that encodes test command input information to generate a testbench signal, converts a computer output signal to generate physical layer information, processes one of the testbench signal and physical layer information as digital reception information to output interface output information, and converts digital transmission information generated in response to the digital reception information or interface input information to output a computer input signal or decodes the digital transmission information to output debugging information; and
a back-up device that outputs the interface input information as information of a result obtained by executing the test command in response to the interface output information.

9. The disc interface system as claimed in claim 8, further comprising a computer that generates the computer output signal corresponding to a command of accessing the back-up device and processes the computer input signal corresponding to the interface input information.

10. The disc interface system as claimed in claim 8, wherein the test command input information includes information corresponding to at least one of commands IDENTIFY DEVICE, SET FEATURE, READ MULTIPLE, WRITE MULTIPLE, READ DMA and WRITE DMA.

11. The disc interface system as claimed in claim 8, wherein the disc interface comprises:
a test unit that encodes the test command input information in response to a second logic state of a test enable signal to generate the testbench signal as the digital reception information and decodes the digital transmission information input as a test result to output the debugging information, the test unit not outputting the testbench signal and debugging information at a first logic state of the test enable signal;
a physical layer unit that converts the computer output signal to output the physical layer information as the digital reception information and converts the digital transmission information to generate the computer input signal;
a multiplexer that selects one of the testbench signal and physical layer information in response to the logic state of the test enable signal to output the digital reception information; and
a digital processing unit that processes the digital reception information to output the interface output information and generates the digital transmission information in response to the digital reception information or interface input information.

12. A disc interfacing method, comprising:
encoding test command input information in response to a second logic state of a test enable signal to generate a testbench signal as digital reception information and decoding digital transmission information input as a test result to output debugging information, outputting none of the testbench signal and debugging information at a first logic state of the test enable signal;
converting a computer output signal to output physical layer information as the digital reception information and converting the digital transmission information to generate a computer input signal;
selecting one of the testbench signal and physical layer information in response to the logic state of the test enable signal to output the digital reception information; and
processing the digital reception information to output interface output information and generating the digital transmission information in response to the digital reception information or interface input information.

13. The disc interfacing method as claimed in claim 12, wherein the testbench signal is information generated by encoding and scrambling the test command input information, and the debugging information is generated by decoding and descrambling the digital transmission information.

14. The disc interfacing method as claimed in claim 12, wherein the testbench signal is generated by:
generating storage information corresponding to the test command input information in response to the second logic state of the test enable signal;
storing the test command input information in response to the storage information; and
encoding and scrambling the test command input information to generate the testbench signal.

15. The disc interfacing method as claimed in claim 12, wherein the debugging information is generated by:
storing and outputting the digital transmission information; and
decoding and descrambling the digital transmission information to output the debugging information.

16. The disc interfacing method as claimed in claim 15, wherein storing the digital transmission information includes outputting information on the occupied capacity of a memory in response to the storage of the digital transmission information, and deciding that overflow occurs when the occupied capacity of the memory exceeds a threshold to output hold primitive information through a connection line through which the testbench signal is output.

17. The disc interfacing method as claimed in claim 13, wherein the debugging information can be used as a part of the test command information.

18. The disc interfacing method as claimed in claim 12, wherein the computer output signal and computer input signal are differential signals.

19. A disc interfacing method, comprising:
encoding test command input information to generate a testbench signal;
converting a computer output signal to generate physical layer information;
processing one of the testbench signal and physical layer information as digital reception information, to output interface output information;

converting digital transmission information generated in response to the digital reception information or interface input information to output a computer input signal;

decoding the digital transmission information to output debugging information; and outputting the interface input information by a back-up device as information of a result, obtained when the back-up device executes the test command, in response to the interface output information.

20. The disc interfacing method as claimed in claim 19, further comprising generating the computer output signal corresponding to a command of accessing the back-up device by a computer, and processing the computer input signal corresponding to the interface input information.

21. The disc interfacing method as claimed in claim 19, wherein the test command input information includes information corresponding to at least one of commands IDENTIFY DEVICE, SET FEATURE, READ MULTIPLE, WRITE MULTIPLE, READ DMA and WRITE DMA.

22. The disc interfacing method as claimed in claim 19, wherein the test command input information and computer output signal are processed by:

encoding the test command input information in response to a second logic state of a test enable signal to generate the testbench signal as the digital reception information and decoding the digital transmission information input as a test result to output the debugging information, outputting none of the testbench signal and debugging information at a first logic state of the test enable signal;

converting the computer output signal to a digital signal to output the physical layer information as the digital reception information and converting the digital transmission information to generate the computer input signal;

selecting one of the testbench signal and physical layer information in response to the logic state of the test enable signal to output the digital reception information; and processing the digital reception information to output the interface output information and generating the digital transmission information in response to the digital reception information or interface input information.

* * * * *